United States Patent
Shikauchi et al.

(10) Patent No.: US 10,297,557 B2
(45) Date of Patent: May 21, 2019

(54) SEMICONDUCTOR DEVICE AND METHOD FOR MANUFACTURING THE SEMICONDUCTOR DEVICE

(71) Applicant: Sanken Electric Co., Ltd., Saitama (JP)

(72) Inventors: Hiroshi Shikauchi, Saitama (JP); Satoru Washiya, Saitama (JP); Youhei Ohno, Saitama (JP); Tomonori Hotate, Saitama (JP); Hiromichi Kumakura, Saitama (JP)

(73) Assignee: Sanken Electric Co., Ltd., Saitama (JP)

(*) Notice: Subject to any disclaimer, the term of this patent is extended or adjusted under 35 U.S.C. 154(b) by 5 days.

(21) Appl. No.: 15/638,515

(22) Filed: Jun. 30, 2017

(65) Prior Publication Data

US 2019/0006292 A1  Jan. 3, 2019

(51) Int. Cl.
*H01L 23/00* (2006.01)
*H01L 29/16* (2006.01)
*H01L 21/78* (2006.01)
*H01L 21/56* (2006.01)

(52) U.S. Cl.
CPC ............ *H01L 23/562* (2013.01); *H01L 21/56* (2013.01); *H01L 21/78* (2013.01); *H01L 29/1608* (2013.01)

(58) Field of Classification Search
CPC ... H01L 23/562; H01L 29/1608; H01L 21/56; H01L 21/78
USPC .......................................................... 257/77
See application file for complete search history.

(56) References Cited

U.S. PATENT DOCUMENTS 5,187,547 A * 2/1993 Niina .................. H01L 33/0054
257/103
2014/0291697 A1 10/2014 Rupp et al.

* cited by examiner

*Primary Examiner* — Fernando L Toledo
*Assistant Examiner* — Adam S Bowen
(74) *Attorney, Agent, or Firm* — Harness, Dickey & Pierce, P.L.C.

(57) ABSTRACT

A semiconductor device and a method for manufacturing the semiconductor device. The semiconductor device includes a silicon carbide substrate and a protective film covering at least partly a main surface of the silicon carbide substrate and one or more side surfaces of the silicon carbide substrate. Therefore, contact of the side surface of the silicon carbide substrate with the moisture gathering material may be avoided, and the breakdown behavior and the long-term reliability of the semiconductor device may be further improved.

19 Claims, 7 Drawing Sheets

SEMICONDUCTOR DEVICE AND METHOD FOR MANUFACTURING THE SEMICONDUCTOR DEVICE

TECHNICAL FIELD

Embodiments of the present disclosure generally relate to the field of semiconductors, and more particularly, to a semiconductor device and a method for manufacturing the semiconductor device.

BACKGROUND

A semiconductor device (or may be referred to as a semiconductor element, component, apparatus, and so on) may include a silicon carbide substrate, an inorganic passivation structure which is configured at least partly on a main surface of the silicon carbide substrate and a molding material layer which is adjacent to the inorganic passivation structure.

Therefore, by using an inorganic passivation structure for protecting the main surface of the silicon carbide substrate, an electric field may be sufficiently reduced for direct contact with the molding material layer and contact of the main surface of the silicon carbide substrate with a moisture gathering material may be avoided. In this way, a breakdown behavior and a long-term reliability of the semiconductor device may be improved.

This section introduces aspects that may facilitate a better understanding of the disclosure. Accordingly, the statements of this section are to be read in this light and are not to be understood as admissions about what is in the prior art or what is not in the prior art.

SUMMARY

However, the inventor found that only the main surface of the silicon carbide substrate is covered by the inorganic passivation structure, one or more side surfaces of the silicon carbide substrate cannot be protected and contact of the side surfaces of the silicon carbide substrate with the moisture gathering material cannot be avoided. Therefore, the breakdown behavior and the long-term reliability of the semiconductor device need to be further improved.

In order to solve at least part of the above problems, methods, apparatus, devices are provided in the present disclosure. Features and advantages of embodiments of the present disclosure will also be understood from the following description of specific embodiments when read in conjunction with the accompanying drawings, which illustrate, by way of example, the principles of embodiments of the present disclosure.

In general, embodiments of the present disclosure provide a semiconductor device and a method for manufacturing the semiconductor device.

In a first aspect, a semiconductor device is provided. The semiconductor device includes a silicon carbide substrate and a protective film covering at least partly a main surface of the silicon carbide substrate and one or more side surfaces of the silicon carbide substrate.

In one embodiment, the semiconductor device further includes a molding material layer covering the protective film and/or a part of the silicon carbide substrate.

In one embodiment, the protective film includes at least three layers.

In one embodiment, a middle layer including at least silicon oxide nitride is configured in the protective film, and/or, an outer layer including at least metal nitride is configured in the protective film.

In one embodiment, the protective film includes a silicon oxide layer contacting with the silicon carbide substrate; a silicon oxide nitride layer covering the silicon oxide layer; and a silicon nitride layer covering the silicon oxide nitride layer.

In one embodiment, the protective film includes a silicon oxide layer contacting with the silicon carbide substrate; a silicon oxide nitride layer covering the silicon oxide layer; and an aluminum nitride layer covering the silicon oxide nitride layer.

In one embodiment, the protective film includes a silicon oxide layer contacting with the silicon carbide substrate; a silicon oxide nitride layer covering the silicon oxide layer; an aluminum oxide nitride layer covering the silicon oxide nitride layer; and an aluminum nitride layer covering on the aluminum oxide nitride layer.

In one embodiment, the protective film includes at least an interrupted area; the main surface of the silicon carbide substrate is uncovered by the protective film within the interrupted area.

In one embodiment, the main surface of the silicon carbide substrate in the interrupted area is aligned with a surface of the protective film.

In one embodiment, the main surface of the silicon carbide substrate in the interrupted area is higher than a surface of the protective film.

In a second aspect, a method for manufacturing a semiconductor device is provided. The method includes providing a silicon carbide component; manufacturing one or more grooves on the silicon carbide component to form one or more silicon carbide substrates; providing a protective film in the one or more grooves; and dividing the protective film to form one or more semiconductor devices; the protective film is covered on at least partly a main surface of the silicon carbide substrate and one or more side surfaces of the silicon carbide substrate.

In one embodiment, the method further includes providing a molding material layer covering the protective film and/or a part of the silicon carbide substrate.

According to various embodiments of the present disclosure, a protective film is provided to cover at least partly a main surface of a silicon carbide substrate and one or more side surfaces of the silicon carbide substrate. Therefore, contact of the side surface of the silicon carbide substrate with the moisture gathering material may be avoided, and the breakdown behavior and the long-term reliability of the semiconductor device may be further improved.

BRIEF DESCRIPTION OF THE DRAWINGS

The above and other aspects, features, and benefits of various embodiments of the disclosure will become more fully apparent, by way of example, from the following detailed description with reference to the accompanying drawings, in which like reference numerals or letters are used to designate like or equivalent elements. The drawings are illustrated for facilitating better understanding of the embodiments of the disclosure and not necessarily drawn to scale, in which.

DETAILED DESCRIPTION

The present disclosure will now be described with reference to several example embodiments. It should be understood that these embodiments are discussed only for the purpose of enabling those skilled persons in the art to better understand and thus implement the present disclosure, rather than suggesting any limitations on the scope of the present disclosure.

It should be understood that when an element is referred to as being "connected" or "coupled" or "contacted" to another element, it may be directly connected or coupled or contacted to the other element or intervening elements may be present. In contrast, when an element is referred to as being "directly connected" or "directly coupled" or "directly contacted" to another element, there are no intervening elements present. Other words used to describe the relationship between elements should be interpreted in a like fashion (e.g., "between" versus "directly between", "adjacent" versus "directly adjacent", etc.).

As used herein, the terms "first" and "second" refer to different elements. The singular forms "a" and "an" are intended to include the plural forms as well, unless the context clearly indicates otherwise. The terms "comprises," "comprising," "has," "having," "includes" and/or "including" as used herein, specify the presence of stated features, elements, and/or components and the like, but do not preclude the presence or addition of one or more other features, elements, components and/or combinations thereof.

The term "based on" is to be read as "based at least in part on". The term "cover" is to be read as "at least in part cover". The term "one embodiment" and "an embodiment" are to be read as "at least one embodiment". The term "another embodiment" is to be read as "at least one other embodiment". Other definitions, explicit and implicit, may be included below.

In this disclosure, unless otherwise defined, all terms (including technical and scientific terms) used herein have the same meaning as commonly understood by one of ordinary skill in the art to which example embodiments belong. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein.

A First Aspect of Embodiments

A semiconductor device is provided in those embodiments.

Figure 1:
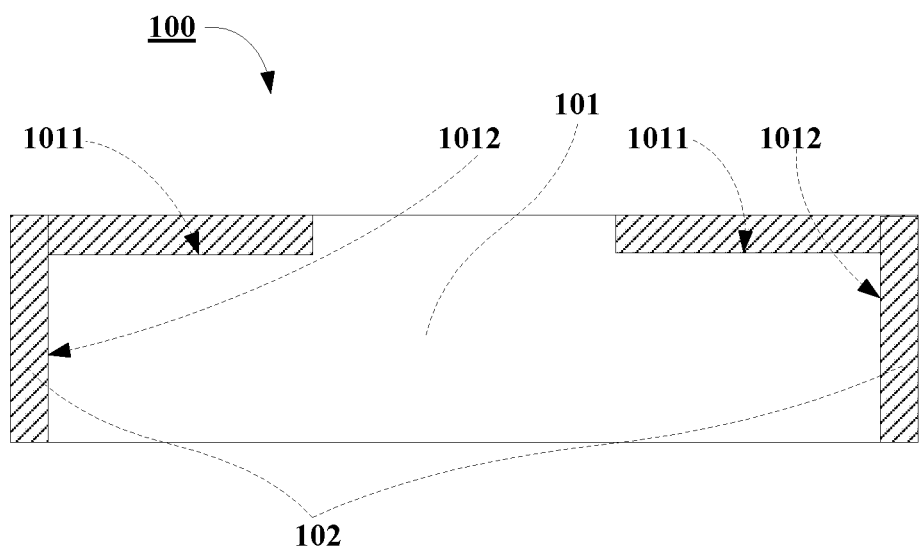
FIG. 1 is a diagram which shows a schematic illustration of a cross-section of a semiconductor device 100 in accordance with an embodiment of the present disclosure.

FIG. 1 is a diagram which shows a schematic illustration of a cross-section of a semiconductor device 100 in accordance with an embodiment of the present disclosure. As shown in FIG. 1, the semiconductor device 100 includes a silicon carbide substrate 101; and a protective film 102 covering at least partly a main surface 1011 of the silicon carbide substrate 101 and one or more side surfaces 1012 of the silicon carbide substrate 101.

The silicon carbide substrate 101 may be a semiconductor substrate based on silicon carbide (SiC) and the silicon substrate 101 may include at least silicon carbide, e.g., concentration of the silicon carbide is more than 50%, more than 70% or more than 90%. The silicon carbide substrate 101 may include configuration (e.g. regarding epitaxial layer arrangement and doping) depending on a type the semiconductor device 100, e.g., Schottky diode, p-n diode, bipolar transistor, field effect transistor, metal oxide semiconductor transistor or junction gate field effect transistor. However, it is not limited thereto in this disclosure.

The main surface 1011 of the silicon carbide substrate 101 may be a surface towards metal layers, insulation layers or passivation layers on top of the silicon carbide substrate 101. In comparison to a basically vertical edge surface (it may be referred to as a side surface in this disclosure) of the silicon carbide substrate 101, the main surface 1011 of the silicon carbide substrate 101 may be a basically horizontal surface.

The main surface 1011 of the silicon carbide substrate 101 may be an interface for connecting at least a part of active areas (e.g. semiconductor regions used for implementing an electrical functionality of the semiconductor device 100) of the silicon carbide substrate 101 to a metal layer, e.g. implementing a bond pad or connecting the active areas to a bond pad. Furthermore, the silicon carbide substrate 101 may include a backside surface opposite to the main surface 1011.

The one or more side surfaces 1012 (for example, there are four side surfaces) may be the surfaces resulting from separating the silicon carbide substrate 101 of the semiconductor device 100 from others. The side surfaces 1012 may be orthogonal to the main surface 1011 of the silicon carbide substrate 101.

As shown in FIG. 1, the protective film 102 is arranged not only on the main surface 1011 of the silicon carbide substrate 101 but also on the side surfaces 1012 of the silicon carbide substrate 101. Therefore, one or more side surfaces 1012 of the silicon carbide substrate 101 may be protected.

Figure 2:
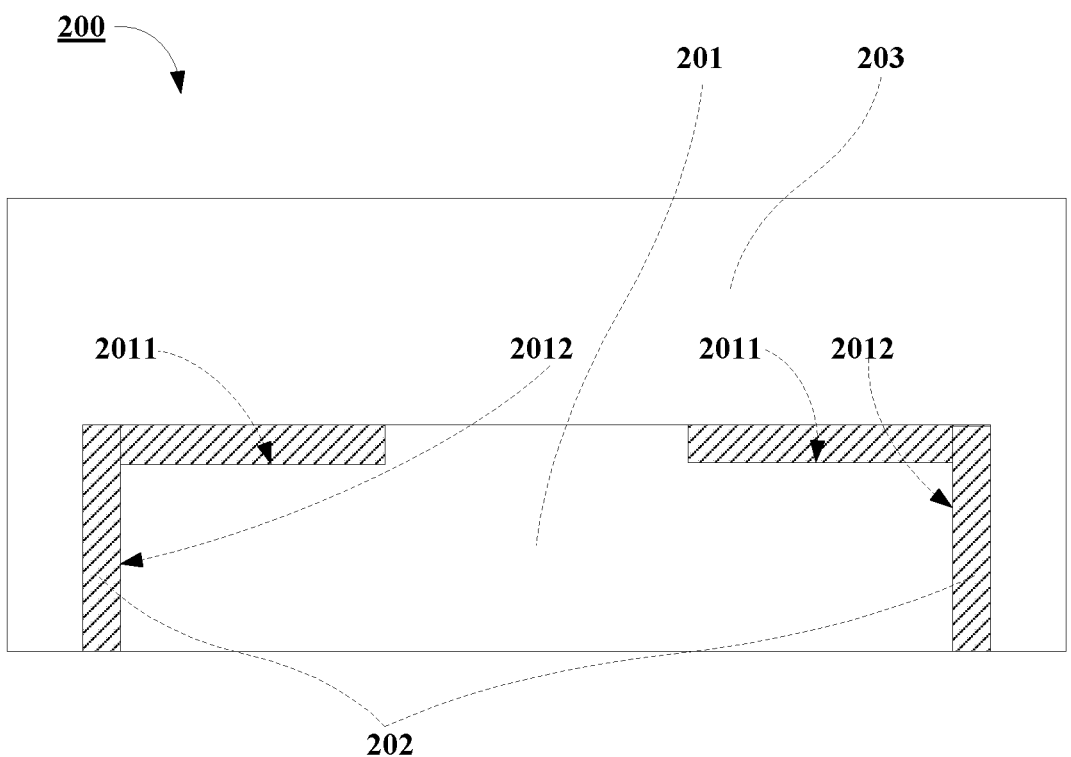
FIG. 2 is a diagram which shows a schematic illustration of a cross-section of a semiconductor device 200 in accordance with an embodiment of the present disclosure.

FIG. 2 is a diagram which shows a schematic illustration of a cross-section of a semiconductor device 200 in accordance with an embodiment of the present disclosure. As shown in FIG. 2, the semiconductor device 200 includes a silicon carbide substrate 201; and a protective film 202 covering at least partly a main surface 2011 of the silicon carbide substrate 201 and one or more side surfaces 2012 of the silicon carbide substrate 201.

As shown in FIG. 2, the semiconductor device 200 may further include a molding material layer 203 covering the protective film 202 and at least a part of the silicon carbide substrate 201.

Therefore, contact of the side surfaces 2012 of the silicon carbide substrate 201 with the moisture gathering material may be avoided. In addition, the breakdown behavior and the long-term reliability of the semiconductor device 200 may be further improved.

In an embodiment, the protective film 102 or 202 may include at least three layers. The protective film 102 or 202 may have a thickness, for example, between 2 µm and 10 µm, or between 2.5 µm and 5 µm, or between 3 µm and 4 µm; but it is not limited thereto. Furthermore, the thickness of the layers in the protective film may be determined according to actual scenarios.

In comparison to a conventional protective layer which has one or two layers (e.g. a silicon oxide layer and/or a silicon nitride layer), the protective film 102 or 202 having at least three layers of this disclosure may reduce a stress between layers and reliability of the protective film may be improved.

In an embodiment, a middle layer including at least silicon oxide nitride (SiON) may be configured in the protective film. A proportion of the SiON in the middle layer may be, e.g., more than 50%, 70% or 90%, but it is not limited thereto. Next, a layer including at least silicon oxide nitride will be referred to as a silicon oxide nitride layer.

In an embodiment, an outer layer including at least metal nitride may be configured in the protective film. Next, a layer including at least aluminum nitride (AlN) will be illustrated as an example, however it is not limited in this disclosure; for example, other metal nitride layers may be adopted according to actual scenarios.

Furthermore, a proportion of the AlN in the outer layer may be, e.g., more than 50%, 70% or 90%, but it is not limited thereto. Next, the layer including at least mainly aluminum nitride will be referred to as an aluminum nitride layer. Alternatively, a layer including at least silicon oxide will be referred to as a silicon oxide layer, a layer including at least silicon nitride will be referred to as a silicon nitride layer, a layer including at least aluminum oxide nitride will be referred to as an aluminum oxide nitride layer.

For example, the protective film may include a silicon oxide ($SiO_2$) layer contacting with the silicon carbide substrate; a silicon oxide nitride (SiON) layer covering the silicon oxide layer; and a silicon nitride (SiN) layer covering the silicon oxide nitride layer.

Figure 3:
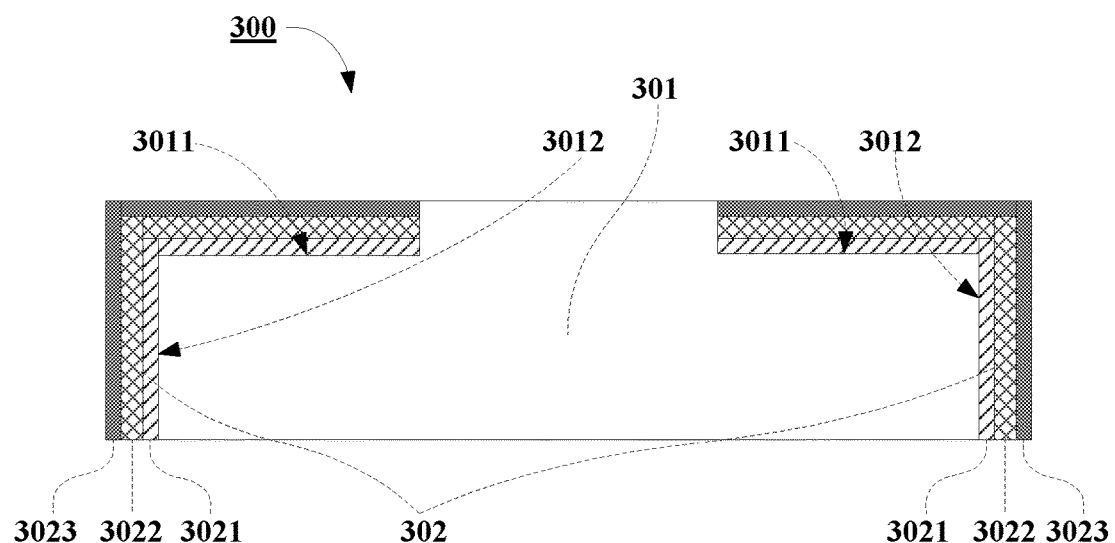
FIG. 3 is a diagram which shows a schematic illustration of a cross-section of a semiconductor device 300 in accordance with an embodiment of the present disclosure.

FIG. 3 is a diagram which shows a schematic illustration of a cross-section of a semiconductor device 300 in accordance with an embodiment of the present disclosure. As shown in FIG. 3, the semiconductor device 300 includes a silicon carbide substrate 301; and a protective film 302 covering at least partly a main surface 3011 of the silicon carbide substrate 301 and one or more side surfaces 3012 of the silicon carbide substrate 301.

As shown in FIG. 3, the protective film 302 may include a silicon oxide ($SiO_2$) layer 3021 which contacts with the silicon carbide substrate 301; a silicon oxide nitride (SiON) layer 3022 which is configured on (or may also be referred to as covering) the silicon oxide layer 3021; and a silicon nitride (SiN) layer 3023 which is configured on the silicon oxide nitride layer 3022.

Therefore, the structure of the protective film includes at least three layers (such as $SiO_2$/SiON/SiN); the stress between layers may be reduced and reliability of the protective film may be improved.

For another example, the protective film may include a silicon oxide ($SiO_2$) layer contacting with the silicon carbide substrate; a silicon oxide nitride (SiON) layer covering the silicon oxide layer; and an aluminum nitride (AlN) layer covering the silicon oxide nitride layer.

Figure 4:
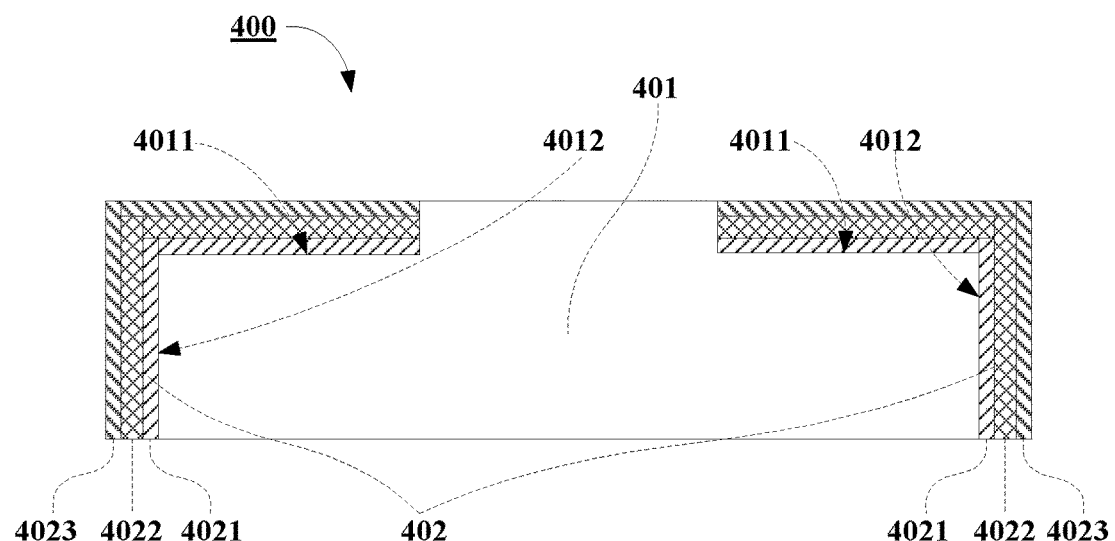
FIG. 4 is a diagram which shows a schematic illustration of a cross-section of a semiconductor device 400 in accordance with an embodiment of the present disclosure.

FIG. 4 is a diagram which shows a schematic illustration of a cross-section of a semiconductor device 400 in accordance with an embodiment of the present disclosure. As shown in FIG. 4, the semiconductor device 400 includes a silicon carbide substrate 401; and a protective film 402 covering at least partly a main surface 4011 of the silicon carbide substrate 401 and one or more side surfaces 4012 of the silicon carbide substrate 401.

As shown in FIG. 4, the protective film 402 may include a silicon oxide ($SiO_2$) layer 4021 which contacts with the silicon carbide substrate 401; a silicon oxide nitride (SiON) layer 4022 which is configured on the silicon oxide layer 4021; and an aluminum nitride (AlN) layer 4023 which is configured on the silicon oxide nitride layer 4022.

Therefore, the structure of the protective film includes at least three layers (such as $SiO_2$/SiON/AlN); the stress between layers may be reduced and reliability of the protective film may be improved. Furthermore, the outer surface of the protective film includes metal material (such as AlN), thermal conductivity of the protective film may be increased and heat dispersion of the semiconductor device may be improved.

For another example, the protective film may include a silicon oxide ($SiO_2$) layer contacting with the silicon carbide substrate; a silicon oxide nitride (SiON) layer covering the silicon oxide layer; an aluminum oxide nitride (AlON) layer covering the silicon oxide nitride layer; and an aluminum nitride (AlN) layer covering the aluminum oxide nitride layer.

Figure 5:
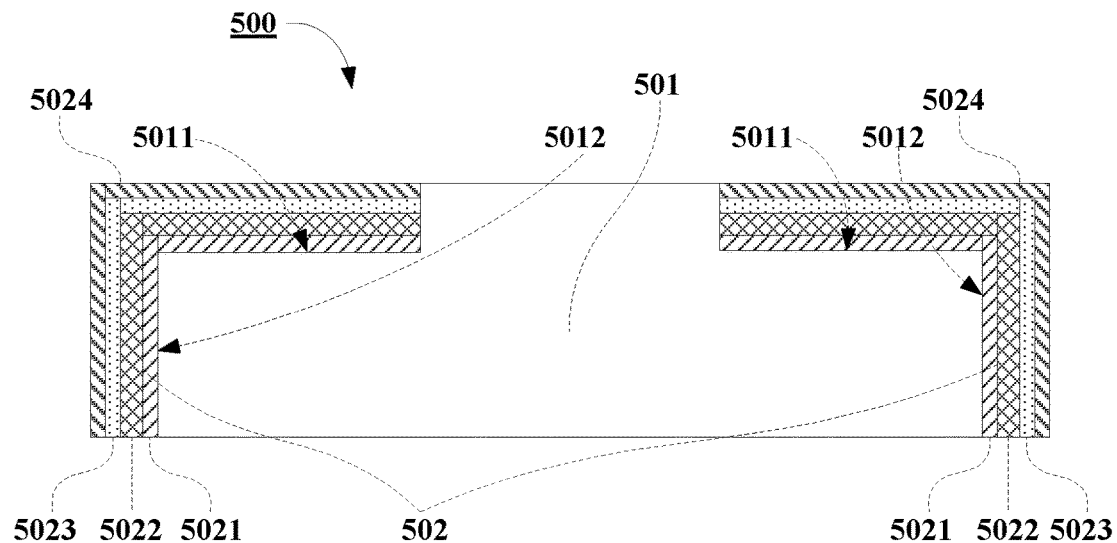
FIG. 5 is a diagram which shows a schematic illustration of a cross-section of a semiconductor device 500 in accordance with an embodiment of the present disclosure.

FIG. 5 is a diagram which shows a schematic illustration of a cross-section of a semiconductor device 500 in accordance with an embodiment of the present disclosure. As shown in FIG. 5, the semiconductor device 500 includes a silicon carbide substrate 501; and a protective film 502 covering at least partly a main surface 5011 of the silicon carbide substrate 501 and one or more side surfaces 5012 of the silicon carbide substrate 501.

As shown in FIG. 5, the protective film 502 may include a silicon oxide ($SiO_2$) layer 5021 which contacts with the silicon carbide substrate 501; a silicon oxide nitride (SiON) layer 5022 which is configured on the silicon oxide layer 5021; an aluminum oxide nitride (AlON) layer 5023 which is configured on the silicon oxide nitride layer 5022; and an aluminum nitride (AlN) layer 5024 which is configured on the aluminum oxide nitride layer 5023.

Therefore, the structure of the protective film includes at least three layers (such as $SiO_2$/SiON/AlON/AlN); the stress between layers may be reduced and reliability of the protective film further may be improved. Furthermore, the outer surface of the protective film includes metal material (such as AlON and AlN), thermal conductivity of the protective film further may be increased and heat dispersion of the semiconductor device may be improved.

It should be appreciated that FIG. 3 to FIG. 5 are only examples of the protective film, but it is not limited thereto. For example, other layers may also be adopted according to actual scenarios. Furthermore, for the sake of simplify, a molding material layer is omitted in FIG. 3 to FIG. 5. But it is not limited thereto, for example, the molding material layer may be added according to actual scenarios.

In an embodiment, the protective film may include at least an interrupted area, the main surface of the silicon carbide substrate is uncovered by the protective film within the interrupted area.

In an embodiment, the main surface of the silicon carbide substrate in the interrupted area may be aligned with a surface of the protective film.

Figure 6:
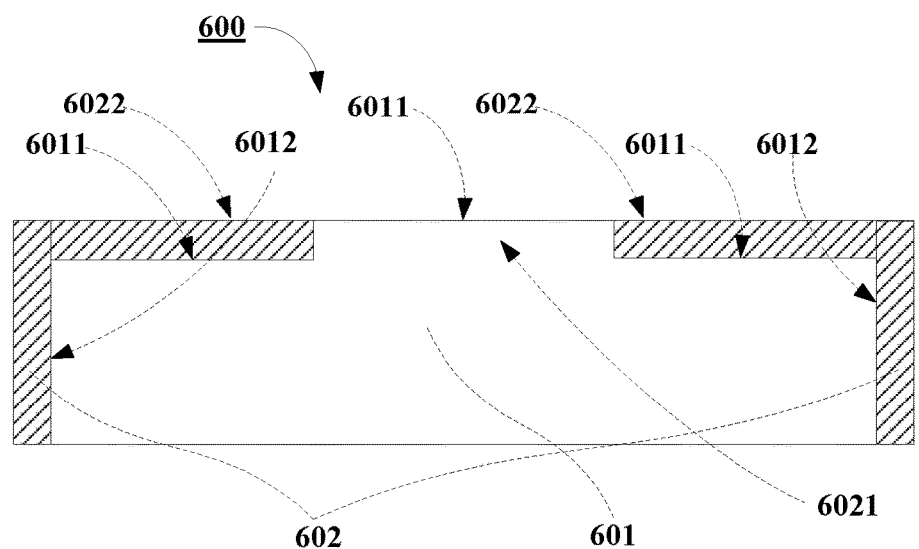
FIG. 6 is a diagram which shows a schematic illustration of a cross-section of a semiconductor device 600 in accordance with an embodiment of the present disclosure.

FIG. 6 is a diagram which shows a schematic illustration of a cross-section of a semiconductor device 600 in accordance with an embodiment of the present disclosure. As shown in FIG. 6, the semiconductor device 600 includes a silicon carbide substrate 601; and a protective film 602 covering at least partly a main surface 6011 of the silicon carbide substrate 601 and one or more side surfaces 6012 of the silicon carbide substrate 601.

As shown in FIG. 6, the protective film 602 may include at least an interrupted area 6021, the main surface 6011 of the silicon carbide substrate 601 is uncovered by the protective film 602 within the interrupted area 6021.

As shown in FIG. 6, the main surface 6011 of the silicon carbide substrate 601 in the interrupted area 6021 may be aligned with a surface 6022 of the protective film 602. That is to say, an altitude of the main surface 6011 of the silicon carbide substrate 601 is identical to the altitude of the surface 6022 of the protective film 602.

Therefore, a stress from the molding material layer may be reduced and reliability of the semiconductor device may be improved.

In an embodiment, the main surface of the silicon carbide substrate in the interrupted area may be higher than a surface of the protective film.

Figure 7:
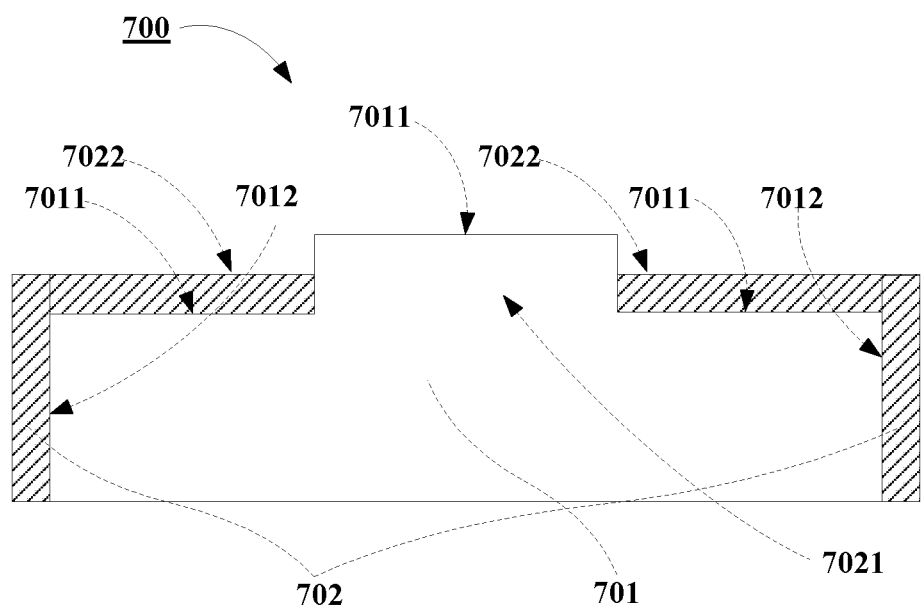
FIG. 7 is a diagram which shows a schematic illustration of a cross-section of a semiconductor device 700 in accordance with an embodiment of the present disclosure.

FIG. 7 is a diagram which shows a schematic illustration of a cross-section of a semiconductor device 700 in accordance with an embodiment of the present disclosure. As shown in FIG. 7, the semiconductor device 700 includes a silicon carbide substrate 701; and a protective film 702 covering at least partly a main surface 7011 of the silicon carbide substrate 701 and one or more side surfaces 7012 of the silicon carbide substrate 701.

As shown in FIG. 7, the protective film 702 may include at least an interrupted area 7021, the main surface 7011 of the silicon carbide substrate 701 is uncovered by the protective film 702 within the interrupted area 7021.

As shown in FIG. 7, the main surface 7011 of the silicon carbide substrate 701 in the interrupted area 7021 may be higher than a surface 7022 of the protective film 702. That is to say, an altitude of the main surface 7011 of the silicon carbide substrate 701 is larger than the altitude of the surface 7022 of the protective film 702.

Therefore, a stress from the molding material layer may be reduced and reliability of the semiconductor device may be improved.

It should be appreciated that FIG. 6 and FIG. 7 are only examples of the protective film, but it is not limited thereto. For example, a plurality of layers of the protective film in FIG. 3 to FIG. 5 may also be adopted according to actual scenarios. Furthermore, for the sake of simplify, a molding material layer is omitted in FIG. 6 and FIG. 7. But it is not limited thereto, for example, the molding material layer may be added according to actual scenarios.

It is to be understood that, the above examples or embodiments are discussed for illustration, rather than limitation. Those skilled in the art would appreciate that there may be many other embodiments or examples within the scope of the present disclosure.

As can be seen from the above embodiments, a protective film is provided to cover at least partly a main surface of a silicon carbide substrate and one or more side surfaces of the silicon carbide substrate. Therefore, contact of the side surface of the silicon carbide substrate with the moisture gathering material may be avoided, and the breakdown behavior and the long-term reliability of the semiconductor device may be further improved.

In addition, the structure of the protective film may include at least three layers; the stress between layers may be reduced and reliability of the protective film may be improved.

In addition, the outer surface of the protective film may include metal material, thermal conductivity of the protective film may be increased and heat dispersion of the semiconductor device may be improved.

In addition, the main surface of the silicon carbide substrate in the interrupted area may be aligned with or higher than a surface of the protective film; the stress from the molding material layer may be reduced and reliability of the semiconductor device may be improved.

A Second Aspect of Embodiments

A method for manufacturing a semiconductor device is provided in these embodiments. The semiconductor device is illustrated in the first aspect of embodiments, and the same contents as those in the first aspect of embodiments are omitted.

Figure 8:
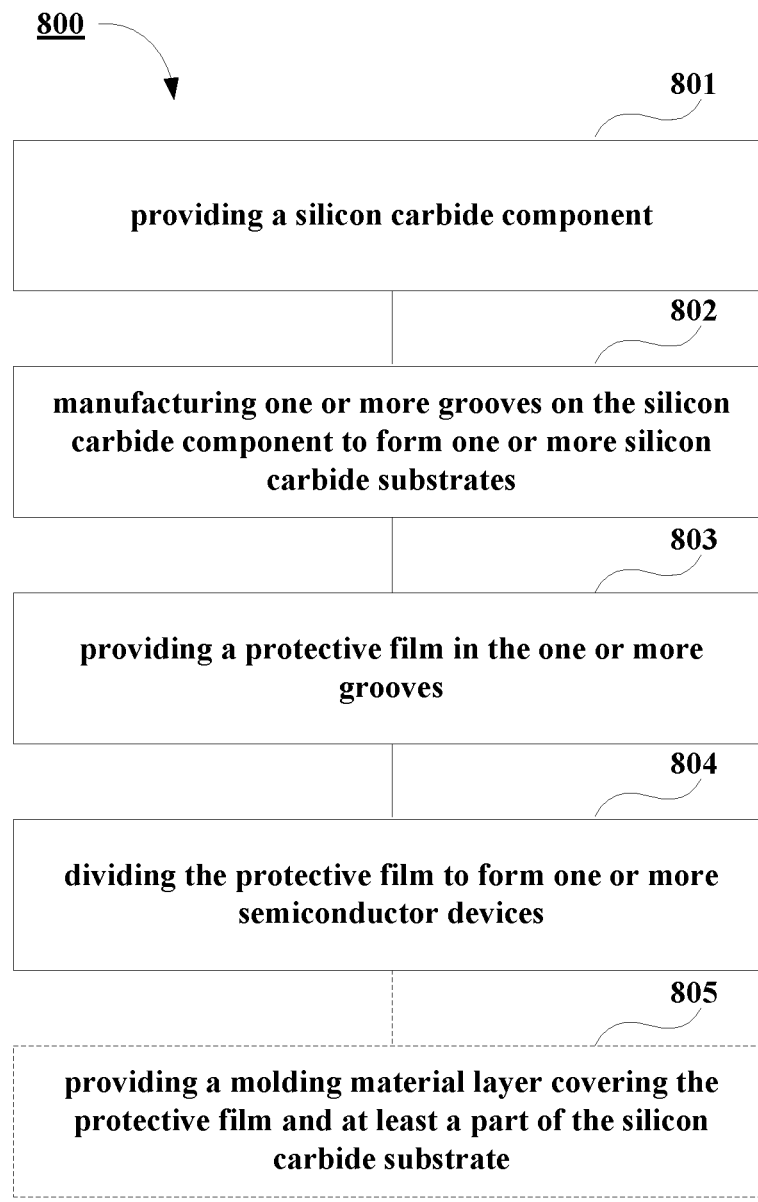
FIG. 8 is a diagram which shows a method for manufacturing a semiconductor device in accordance with an embodiment of the present disclosure.

FIG. 8 is a diagram which shows a method for manufacturing a semiconductor device in accordance with an embodiment of the present disclosure. As shown in FIG. 8, the method 800 includes:

Block 801, providing a silicon carbide component;

Block 802, manufacturing one or more grooves on the silicon carbide component to form one or more silicon carbide substrates;

Block 803, providing a protective film in the one or more grooves; and

Block 804, dividing the protective film to form one or more semiconductor devices; the protective film covering at least partly a main surface of the silicon carbide substrate and one or more side surfaces of the silicon carbide substrate.

As shown in FIG. 8, the method 800 may further include:

Block 805, providing a molding material layer covering the protective film and at least a part of the silicon carbide substrate.

It should be appreciated that FIG. 8 is only an example of the disclosure, but it is not limited thereto. For example, the order of operations at blocks may be adjusted and/or some blocks may be omitted. Moreover, some blocks not shown in FIG. 8 may be added.

FIG. 9 to FIG. 12 are some diagrams which show an example for manufacturing a semiconductor device in accordance with an embodiment of the present disclosure. As an example, FIG. 9 to FIG. 12 show schematic illustrations of forming two semiconductor devices 900 from a cross-sectional view.

Figure 9:
FIG. 9 is a diagram which shows an example for manufacturing a semiconductor device in accordance with an embodiment of the present disclosure.
Figure 10:
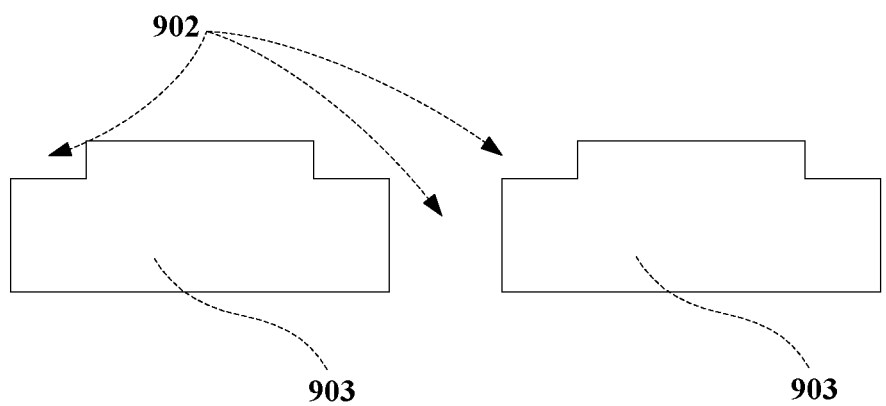
FIG. 10 is another diagram which shows the example for manufacturing a semiconductor device in accordance with an embodiment of the present disclosure.
Figure 11:
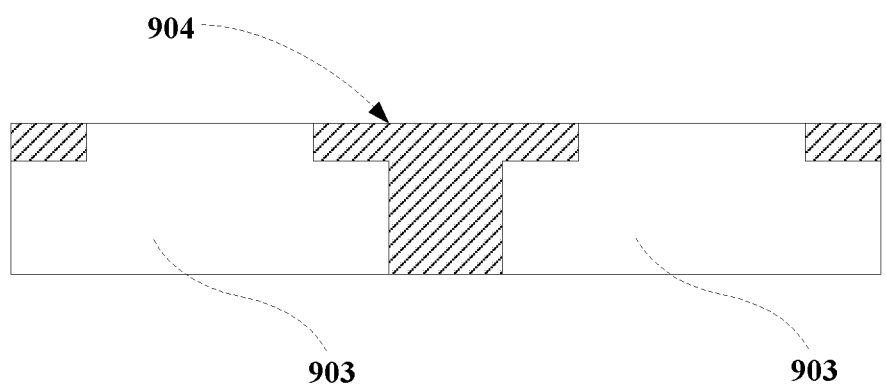
FIG. 11 is another diagram which shows the example for manufacturing a semiconductor device in accordance with an embodiment of the present disclosure.
Figure 12:
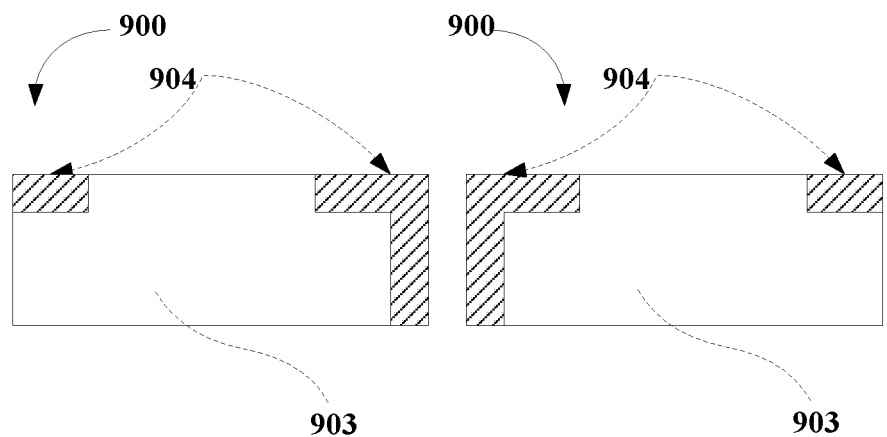
FIG. 12 is another diagram which shows the example for manufacturing a semiconductor device in accordance with an embodiment of the present disclosure.

As shown in FIG. 9, firstly a silicon carbide component 901 is provided. As shown in FIG. 10, one or more grooves 902 is/are provided on the silicon carbide component 901 to form two silicon carbide substrates 903. As shown in FIG. 11, a protective film 904 is provided in the one or more grooves 902. As shown in FIG. 12, then the protective film 904 is divided (or may be referred to as notching or fluting, and so on) to form two semiconductor devices 900.

In this semiconductor device 900, the protective film is covered on at least partly a main surface of the silicon carbide substrate and one or more side surfaces of the silicon carbide substrate. FIG. 1 to FIG. 7 may be referred for the structure of the semiconductor 900.

In an embodiment, the protective film may include at least three layers.

In an embodiment, a middle layer comprising at least silicon oxide nitride is configured in the protective film, and/or, an outer layer comprising at least metal nitride is configured in the protective film.

In an embodiment, the protective film may include: a silicon oxide layer contacting with the silicon carbide substrate; a silicon oxide nitride layer covering the silicon oxide layer; and a silicon nitride layer covering the silicon oxide nitride layer.

In an embodiment, the protective film may include: a silicon oxide layer contacting with the silicon carbide substrate; a silicon oxide nitride layer covering the silicon oxide layer; and an aluminum nitride layer covering the silicon oxide nitride layer.

In an embodiment, the protective film may include: a silicon oxide layer contacting with the silicon carbide substrate; a silicon oxide nitride layer covering the silicon oxide layer; an aluminum oxide nitride layer covering the silicon oxide nitride layer; and an aluminum nitride layer covering the aluminum oxide nitride layer.

In an embodiment, the protective film may include at least an interrupted area; the main surface of the silicon carbide substrate is uncovered by the protective film within the interrupted area.

In an embodiment, the main surface of the silicon carbide substrate in the interrupted area is aligned with a surface of the protective film.

In an embodiment, the main surface of the silicon carbide substrate in the interrupted area is higher than a surface of the protective film.

As can be seen from the above embodiments, a protective film is provided to cover at least partly a main surface of a silicon carbide substrate and one or more side surfaces of the silicon carbide substrate. Therefore, contact of the side surface of the silicon carbide substrate with the moisture gathering material may be avoided, and the breakdown behavior and the long-term reliability of the semiconductor device may be further improved.

In addition, the structure of the protective film may include at least three layers; the stress between layers may be reduced and reliability of the protective film may be improved.

In addition, the outer surface of the protective film may include metal material, thermal conductivity of the protective film may be increased and heat dispersion of the semiconductor device may be improved.

In addition, the main surface of the silicon carbide substrate in the interrupted area may be aligned with or higher than a surface of the protective film; the stress from the molding material layer may be reduced and reliability of the semiconductor device may be improved.

Further, it is expected that one of ordinary skill, notwithstanding possibly significant effort and many design choices motivated by, for example, available time, current technology, and economic considerations, when guided by the concepts and principles disclosed herein will be readily capable of generating such software instructions and programs and integrated circuits (ICs) with minimal experimentation.

Generally, various embodiments of the present disclosure may be implemented in hardware or special purpose circuits, software, logic or any combination thereof. Some aspects may be implemented in hardware, while other aspects may be implemented in firmware or software which may be executed by a controller, microprocessor or other computing device.

While various aspects of embodiments of the present disclosure are illustrated and described as block diagrams, flowcharts, or using some other pictorial representation, it will be appreciated that the blocks, apparatus, systems, techniques or methods described herein may be implemented in, as non-limiting examples, hardware, software, firmware, special purpose circuits or logic, general purpose hardware or controller or other computing devices, or some combination thereof.

Further, while operations are depicted in a particular order, this should not be understood as requiring that such operations be performed in the particular order shown or in sequential order, or that all illustrated operations be performed, to achieve desirable results. In certain circumstances, multitasking and parallel processing may be advantageous.

Likewise, while several specific implementation details are contained in the above discussions, these should not be construed as limitations on the scope of the present disclosure, but rather as descriptions of features that may be specific to particular embodiments. Certain features that are described in the context of separate embodiments may also be implemented in combination in a single embodiment. Conversely, various features that are described in the context of a single embodiment may also be implemented in multiple embodiments separately or in any suitable sub-combination.

Although the present disclosure has been described in language specific to structural features and/or methodological acts, it is to be understood that the present disclosure defined in the appended claims is not necessarily limited to the specific features or acts described above. Rather, the specific features and acts described above are disclosed as example forms of implementing the claims.

What is claimed is:

1. A semiconductor device, comprising:
   a silicon carbide substrate; and
   a protective film covering at least partly a main surface of the silicon carbide substrate and one or more side surfaces of the silicon carbide substrate;
   wherein the protective film comprises at least three layers.

2. The semiconductor device according to the claim 1, wherein the semiconductor device further comprises:
   a molding material layer covering the protective film and a part of the silicon carbide substrate.

3. The semiconductor device according to the claim 1, wherein a middle layer comprising at least silicon oxide nitride is configured in the protective film, and/or, an outer layer comprising at least metal nitride is configured in the protective film.

4. The semiconductor device according to the claim 1, wherein the protective film comprises:
   a silicon oxide layer contacting with the silicon carbide substrate;
   a silicon oxide nitride layer covering the silicon oxide layer; and
   a silicon nitride layer covering the silicon oxide nitride layer.

5. The semiconductor device according to the claim 1, wherein the protective film comprises:
   a silicon oxide layer contacting with the silicon carbide substrate;
   a silicon oxide nitride layer covering the silicon oxide layer; and an aluminum nitride layer covering the silicon oxide nitride layer.

6. The semiconductor device according to the claim 1, wherein the protective film comprises:
- a silicon oxide layer contacting with the silicon carbide substrate;
- a silicon oxide nitride layer covering the silicon oxide layer;
- an aluminum oxide nitride layer covering the silicon oxide nitride layer; and
- an aluminum nitride layer covering on the aluminum oxide nitride layer.

7. The semiconductor device according to the claim 1, wherein the protective film comprises at least an interrupted area, wherein the main surface of the silicon carbide substrate is uncovered by the protective film within the interrupted area.

8. The semiconductor device according to the claim 7, wherein the main surface of the silicon carbide substrate in the interrupted area is aligned with a surface of the protective film.

9. The semiconductor device according to the claim 7, wherein the main surface of the silicon carbide substrate in the interrupted area is higher than a surface of the protective film.

10. A method for manufacturing a semiconductor device, comprising:
- providing a silicon carbide component;
- manufacturing one or more grooves on the silicon carbide component to form one or more silicon carbide substrates;
- providing a protective film in the one or more grooves; and
- dividing the protective film to form one or more semiconductor devices; wherein the protective film covering at least partly a main surface of the silicon carbide substrate and one or more side surfaces of the silicon carbide substrate.

11. The method according to the claim 10, wherein the method further comprises:
- providing a molding material layer covering the protective film and a part of the silicon carbide substrate.

12. The method according to the claim 10, wherein the protective film comprises at least three layers.

13. The method according to the claim 12, wherein a middle layer comprising at least silicon oxide nitride is configured in the protective film, and/or, an outer layer comprising at least metal nitride is configured in the protective film.

14. The method according to the claim 12, wherein the protective film comprises:
- a silicon oxide layer contacting with the silicon carbide substrate;
- a silicon oxide nitride layer covering the silicon oxide layer; and
- a silicon nitride layer covering the silicon oxide nitride layer.

15. The method according to the claim 12, wherein the protective film comprises:
- a silicon oxide layer contacting with the silicon carbide substrate;
- a silicon oxide nitride layer covering the silicon oxide layer; and
- an aluminum nitride layer covering the silicon oxide nitride layer.

16. The method according to the claim 12, wherein the protective film comprises:
- a silicon oxide layer contacting with the silicon carbide substrate;
- a silicon oxide nitride layer covering the silicon oxide layer;
- an aluminum oxide nitride layer covering the silicon oxide nitride layer; and
- an aluminum nitride layer covering the aluminum oxide nitride layer.

17. The method according to the claim 10, wherein the protective film comprises at least an interrupted area, wherein the main surface of the silicon carbide substrate is uncovered by the protective film within the interrupted area.

18. The method according to the claim 17, wherein the main surface of the silicon carbide substrate in the interrupted area is aligned with a surface of the protective film.

19. The method according to the claim 17, wherein the main surface of the silicon carbide substrate in the interrupted area is higher than a surface of the protective film.

* * * * *